(12) United States Patent
Sugihara et al.

(10) Patent No.: US 6,965,149 B2
(45) Date of Patent: Nov. 15, 2005

(54) EPITAXIAL SEMICONDUCTOR WAFER AND A MANUFACTURING METHOD THEREOF

(75) Inventors: Shigenori Sugihara, Tokyo (JP); Shigeru Nagafuchi, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 529 days.

(21) Appl. No.: 10/189,530

(22) Filed: Jul. 8, 2002

(65) Prior Publication Data
US 2003/0010280 A1 Jan. 16, 2003

(30) Foreign Application Priority Data
Jul. 9, 2001 (JP) ........................................ 2001-207364

(51) Int. Cl.⁷ ............................................. H01L 27/01
(52) U.S. Cl. .................... 257/352; 257/347; 257/348; 257/349; 257/350; 257/351; 257/353; 257/354; 257/507
(58) Field of Search ................. 257/347–354, 257/507

(56) References Cited

U.S. PATENT DOCUMENTS
5,362,683 A * 11/1994 Takenaka et al. ........... 438/458

* cited by examiner

*Primary Examiner*—David Nelms
*Assistant Examiner*—Andy Huynh
(74) *Attorney, Agent, or Firm*—Kubovcik & Kubovcik

(57) ABSTRACT

An epitaxial semiconductor wafer having a wafer substrate made of semiconductor single crystal, an epitaxial layer deposited on a top surface of said wafer substrate and a polysilicon layer deposited on a back surface of said wafer substrate. The semiconductor single crystal is exposed in a region defined within a distance of at least 50 μm from a ridge line as a center, which is defined as an intersection line between said back surface and a bevel face interconnecting said top surface and said back surface of said wafer substrate. The polysilicon layer is 1.0 to 2.0 μm thick. The epitaxial layer is 1.0 to 20 μm thick. The wafer substrate is a silicon single crystal.

8 Claims, 11 Drawing Sheets

EPITAXIAL SEMICONDUCTOR WAFER AND A MANUFACTURING METHOD THEREOF

FIELD OF THE INVENTION

The present invention relates to an epitaxial semiconductor wafer and a manufacturing method thereof, and more specifically to an epitaxial semiconductor wafer having a polysilicon film on a back surface thereof and a method for manufacturing the same.

DESCRIPTION OF THE PRIOR ART

Conventionally, there has been used such an epitaxial semiconductor wafer with a polysilicon film, which includes the polysilicon film having a thickness of about 1 $\mu$m deposited on a back surface thereof. The aim of the polysilicon film thus deposited over the back surface of the semiconductor wafer is to obtain a high gettering performance in a device manufacturing process through this film.

This semiconductor wafer with the polysilicon film deposited thereon has been manufactured in the following manner. Specifically, an ingot of single crystal semiconductor is sliced to fabricate a semiconductor wafer, to which chamfering, lapping and etching are applied. With respect to this semiconductor wafer, a polysilicon film is then deposited over an entire surface in a high temperature gas atmosphere by using the low pressure chemical vapor deposition technology. Then, the polysilicon film formed on the surface of this semiconductor wafer is removed by polishing or by etching. By this way, such a semiconductor wafer with the remaining polysilicon film deposited on the back surface thereof can be fabricated.

However, there has arisen a problem in association with the semiconductor wafer having polysilicon film deposited thereon that particles are more apt to be generated during a conveying process and a thermal processing process of the wafer. That is to say, the polysilicon grows into granule through the thermal processing in the device manufacturing process, which in turn produces particles when the growing polysilicon could come into contact with a quartz boat during the thermal processing or when edge portion of the wafer comes into contact with other sites during a conveying process of the wafer.

To solve this problem, there has been disclosed one method for processing a semiconductor wafer having a polysilicon film in Japanese Patent Laid-open Publication No. H7-312360, in which the semiconductor wafer with the polysilicon film deposited thereon is processed over an entire or a part of area defined within a distance of at least 0.5 mm from an edge end thereof by using the polishing or the etching or a combination thereof.

It has been reported that this method of processing can inhibit the generation of particles in the device manufacturing process.

However, the method disclosed in the Japanese Patent Laid-open Publication No. H7-312360 can only remove the polysilicon within the specified area defined within a certain distance from the edge portion in order to prevent the generation of the particles, which has not yet taken an epitaxial growth into consideration.

There has been another such method disclosed in Japanese Patent Laid-open Publication No. H7-6985 that prevents a generation of protrusions (nodules) in an end portion during an epitaxial processing by removing a polycrystal film in the end portion. This method is directed to inhibit the generation of nodules in the end portion, which could be one of the factors for generating the particles during the device manufacturing process.

As discussed above, there has been disclosed no method in the prior art for manufacturing an epitaxial wafer with a polysilicon film deposited on a back surface thereof yet with a reduced amount of the particle generation.

To explain this, although the method disclosed in the Japanese Patent Laid-open Publication No. H7-312360 has been directed to remove the polysilicon from the end portion over a specified range in order to prevent the generation of the particles, it has not yet taken the epitaxial growth into consideration. This publication has not disclosed any epitaxial wafer having a polysilicon film deposited on a back surface thereof yet with a reduced amount of the particle generation or a method for manufacturing such wafer.

On the other hand, according to the method disclosed in the Japanese Patent Laid-open Publication No. H7-6985 for removing the polysilicon film in the end portion before the epitaxial growth, the polysilicon is removed exclusively from the edge portion, resulting in an insufficient work to inhibit the generation of the particles.

In the light of the conditions described above, an object of the present invention is to provide an epitaxial wafer having a polysilicon film deposited on a back surface thereof yet with an extremely small amount of particles to be generated through the handling in the device manufacturing process and also to provide a method for manufacturing the same.

SUMMARY OF THE INVENTION

According to a first invention, there is provided an epitaxial semiconductor wafer having a wafer substrate made of semiconductor single crystal, an epitaxial layer deposited on a top surface of said wafer substrate and a polysilicon layer deposited on a back surface of said wafer substrate, said epitaxial semiconductor wafer characterized in that said semiconductor single crystal is exposed in a region defined within a distance of at least 50 $\mu$m from a ridge line as a center, which is defined as an intersection line between said back surface and a bevel face interconnecting said top surface and said back surface of said wafer substrate.

The inventor of the present invention has inspected a contact condition of the epitaxial wafer with a thermal processing boat in the device manufacturing process and with a jig in a cleaning unit, and found that such contact occurs around the ridge line where the bevel face intersects with the back surface, and that if the epitaxial growth is performed with the polysilicon film remaining in the proximity to the ridge line, the epitaxial reaction gas reaches the proximity to this ridge line and causes the polysilicon to grow into granules over the polysilicon film, which could easily drop, if any contact with the jig, thus producing the particles. To explain this in more specific, it has been found that the epitaxial film would grow but the granulated polysilicon would not grow in such a region that the polysilicon film has been completely removed and thereby the single crystal silicon has been exposed, while the granulated polysilicon or the recrystallized silicon would be generated in conjunction with the epitaxial growth in such a region having the residual polysilicon film even by a small amount. Further, if there is only a small amount of such granulated polysilicon or recrystallized silicon existing in the vicinity of the ridge line, specifically in the area defined within the distance of 50 $\mu$m from the ridge line, any contact of the jig with the vicinity of the ridge line during the thermal processing or the cleaning could cause the particle to be generated.

Accordingly, in order to inhibit the generation of the particles in the device manufacturing process, it is required during the epitaxial growing that no polysilicon is existing in the region defined within the distance of at least 50 μm from the ridge line.

According to a second invention, there is provided an epitaxial semiconductor wafer having a wafer substrate made of semiconductor single crystal and a polysilicon layer deposited on a back surface of said wafer, in which an epitaxial layer is to be formed on a top surface of said wafer substrate, said epitaxial semiconductor wafer characterized in that said semiconductor single crystal is exposed in a region defined within a distance of 300 μm from a ridge line as a center, which is defined as an intersection line between said back surface and a bevel face interconnecting said top surface and said back surface of said wafer substrate.

From the viewpoint aiming for inhibiting the generation of the particles, preferably there is an extended area having no polysilicon during this epitaxial growing, but in the area exceeding 300 μm, the removal of the polysilicon may have little effect on the inhibition, and in addition said removal of the polysilicon requires a plenty of time and additional high pressure in abrasion of the polysilicon and further, this area is made to have an insufficiently low gettering performance resulting in the area unusable as a device, from which it is concluded that the effective region should be defined as within 300 μm.

According to a third invention, in an epitaxial semiconductor wafer as defined in said first or second invention, said polysilicon layer is 1.0 to 2.0 μm thick.

According to a fourth invention, in an epitaxial semiconductor wafer as defined in said first or second invention, said epitaxial layer is 1.0 to 20 μm thick.

According to a fifth invention, in an epitaxial semiconductor wafer as defined in said first or second invention, said wafer substrate is a silicon single crystal.

According to a sixth invention, there is provided a manufacturing method of an epitaxial semiconductor wafer comprising the steps of: a polysilicon layer forming process for forming a polysilicon layer on a back surface of a wafer substrate made of semiconductor single crystal; an exposing process for removing said polysilicon layer and thus exposing said semiconductor single crystal in a region defined within a distance of at least 50 μm from a ridge line as a center, which is defined as an intersection line between said back surface of said wafer substrate and a bevel face thereof; and an epitaxial process for depositing an epitaxial layer on a top surface of the wafer substrate.

As described above, such a region allowing no polysilicon granule to be generated during the epitaxial growth can be obtained by removing totally the polysilicon layer and thus exposing the single crystal silicon face before the epitaxial growing. This means that, in order to obtain the semiconductor device having no generation of polysilicon granules in the area defined within 50 μm from the ridge line after the epitaxial growing, the polysilicon in the area of the substrate wafer defined within al least 50 μm from the ridge line must be removed completely before the starting of the epitaxial growth.

According to a seventh invention, in a manufacturing method of an epitaxial semiconductor wafer as defined in said sixth invention, in said exposing process, the polysilicon layer in a region defined within a distance of 300 μm from said ridge line as a center is removed.

According to an eighth invention, in a manufacturing method of an epitaxial semiconductor wafer as defined in said sixth or seventh invention, in said exposing process, said semiconductor single crystal is exposed in said region by applying a mirror polishing to the bevel face.

According to a ninth invention, in a manufacturing method of an epitaxial semiconductor wafer as defined in said sixth invention, said wafer substrate is a silicon single crystal.

According to a tenth invention, in a manufacturing method of an epitaxial semiconductor wafer as defined in said ninth invention, in said epitaxial process, a silicon single crystal grows on said top surface of the wafer substrate.

According to an eleventh invention, in a manufacturing method of an epitaxial semiconductor wafer as defined in said sixth invention, in said polysilicon layer forming process, the polysilicon layer is formed so as to be 1.0 to 2.0 μm thick.

DESCRIPTION OF THE PREFERRED EMBODIMENTS

Preferred embodiments of the present invention will now be described with reference to the attached drawings. Primarily, a first embodiment of the present invention will be explained in conjunction with FIG. 1 to FIG. 7.

Figure 1:
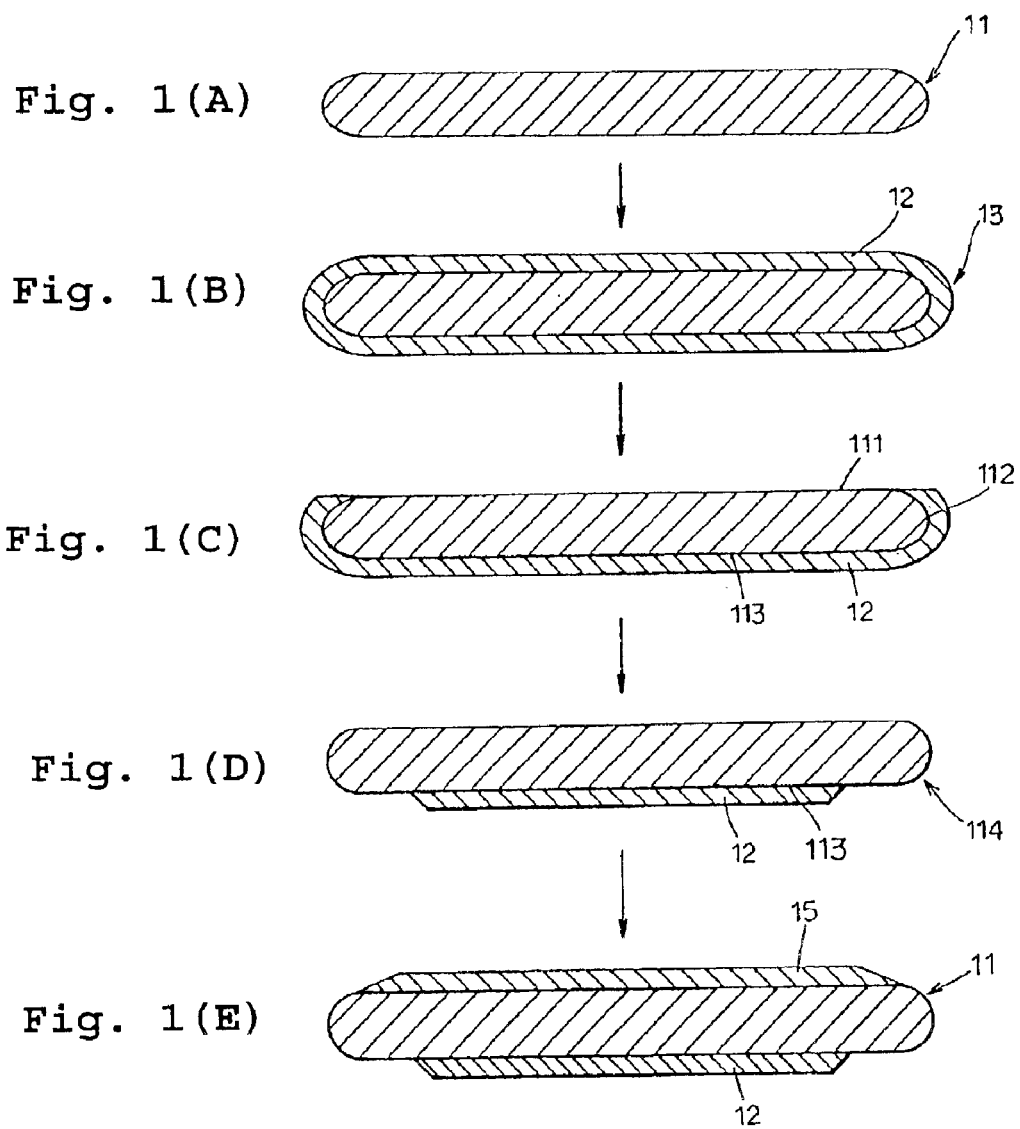
FIG. 1 is a diagram illustrating processes in a manufacturing method of an epitaxial semiconductor wafer according to a first embodiment of the present invention.
Figure 4:
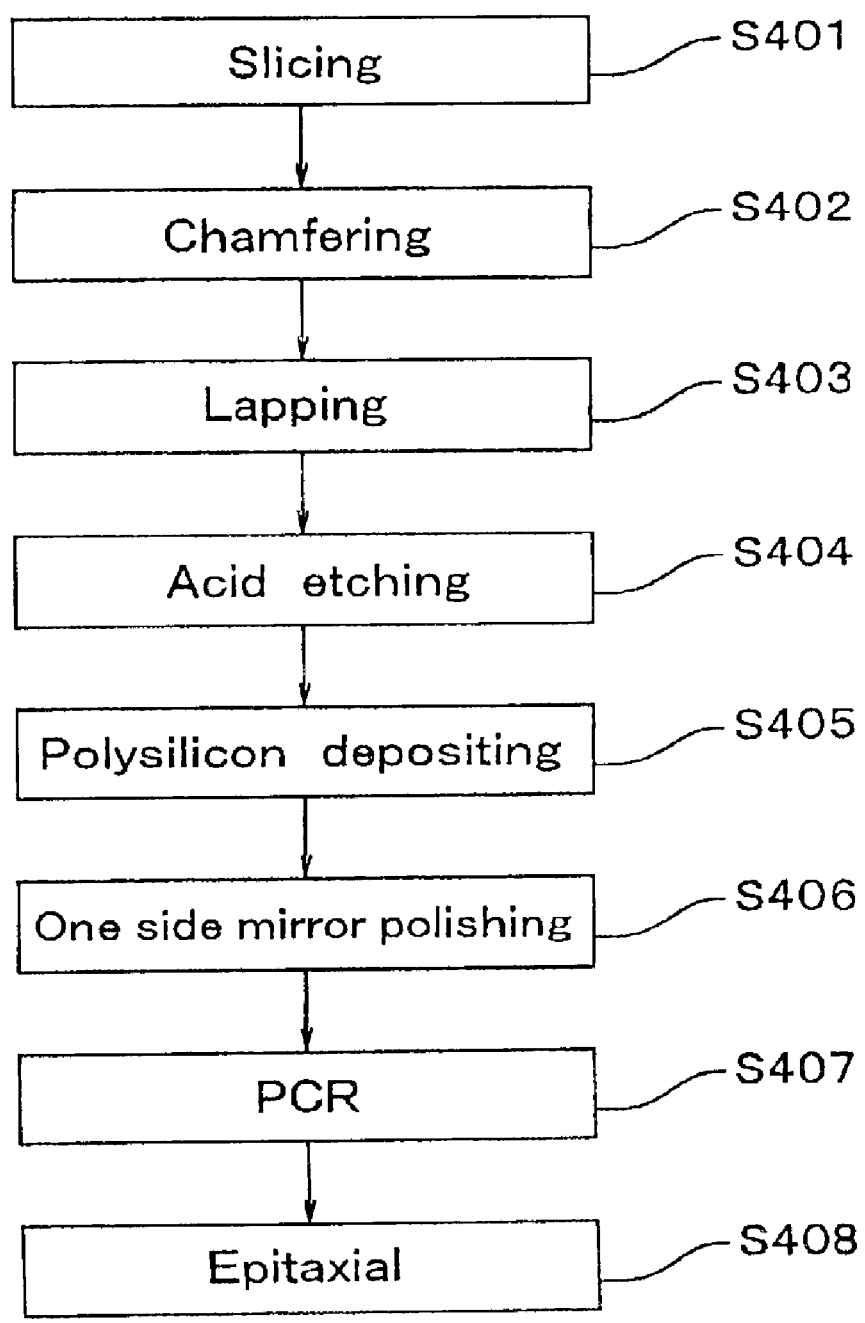
FIG. 4 is a flow chart illustrating processes for manufacturing the epitaxial semiconductor wafer according to the first embodiment of the present invention.

AS shown in FIGS. 1 and 4, in a method for manufacturing an epitaxial wafer according to the present invention, a single crystal ingot pulled up by using the CZ method is sliced with a wire-saw thus to fabricate a silicon wafer (S401).

Chamfering (S402), lapping (S403) and acid etching (S404) are applied in this sequence to this silicon wafer in accordance with a well-known conventional method. In the acid etching, hydrofluoric acid, nitric acid, acetic acid, purified water (ultra pure water or de-ionized water) and the like are used as ingredients of an etchant mixture, and the silicon wafer is dipped in the etchant mixture at the temperature of 30 to 40° C. for 1 to 10 minutes. FIG. 1(A) shows a thus etched wafer 11.

Figure 5:
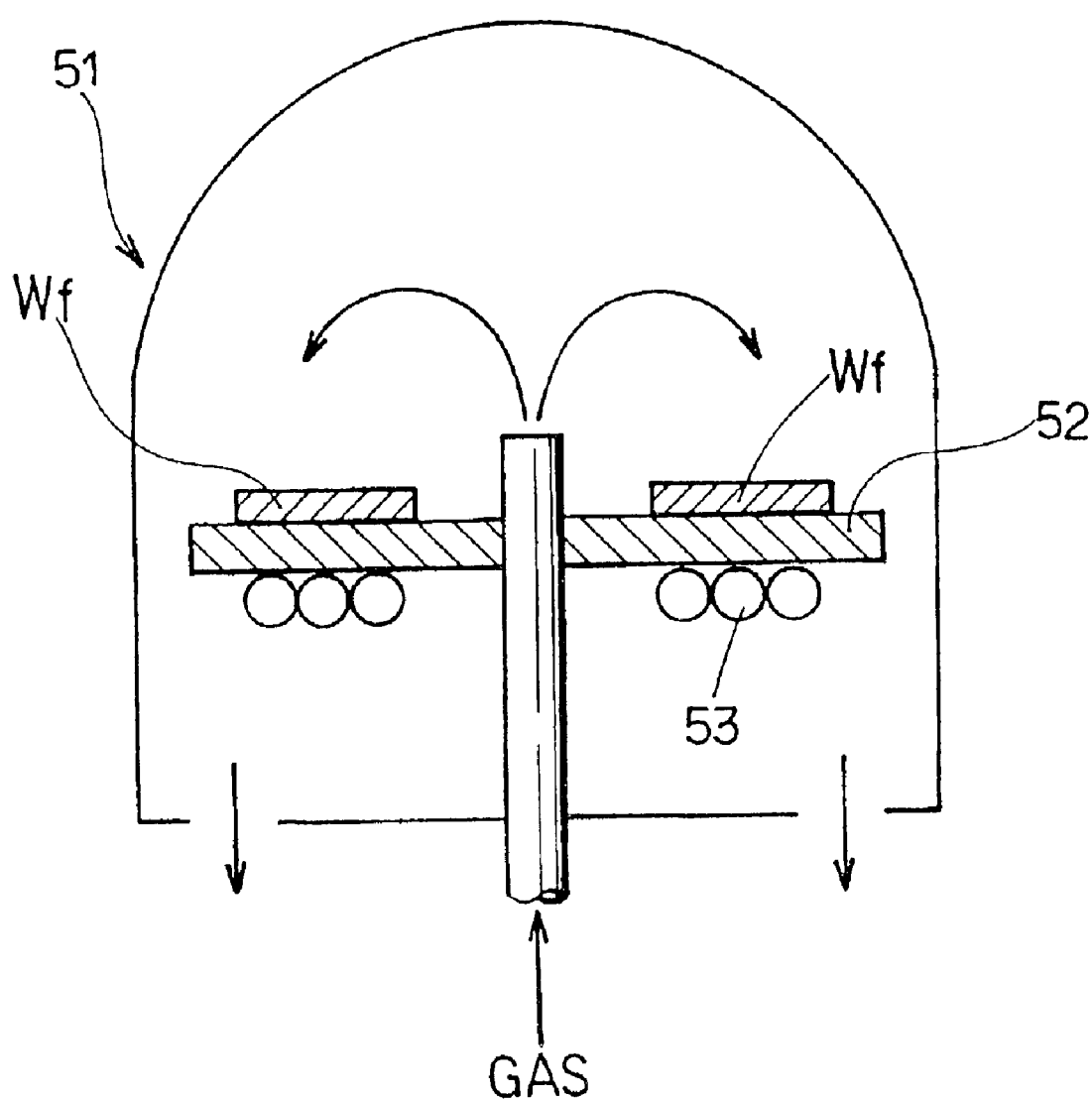
FIG. 5 is a schematic diagram of an epitaxial growth system according to the first embodiment of the present invention.

After having been rinsed with the purified water and dried, this etched wafer is introduced in an upright CVD furnace and mono-silane gas, for example, is supplied into the furnace at a temperature of 650° C. and a pressure level of 0.2 Torr so as to induce thermal-decomposition for one hour, so that a polysilicon film 12 having an averaged film thickness of 1.1 $\mu$m may be generated and thus deposited over an entire area of the wafer (S405). FIG. 5 shows an example of a CVD furnace 51 to be used. In this furnace, the silicon wafer Wf is loaded on a rotating susceptor 52 and heated by means of a high frequency induction coil 53 while supplying said mono-silane gas thereinto. In FIG. 1(B), the silicon wafer 13 is shown with the polysilicon film 12 deposited thereon.

Figure 6:
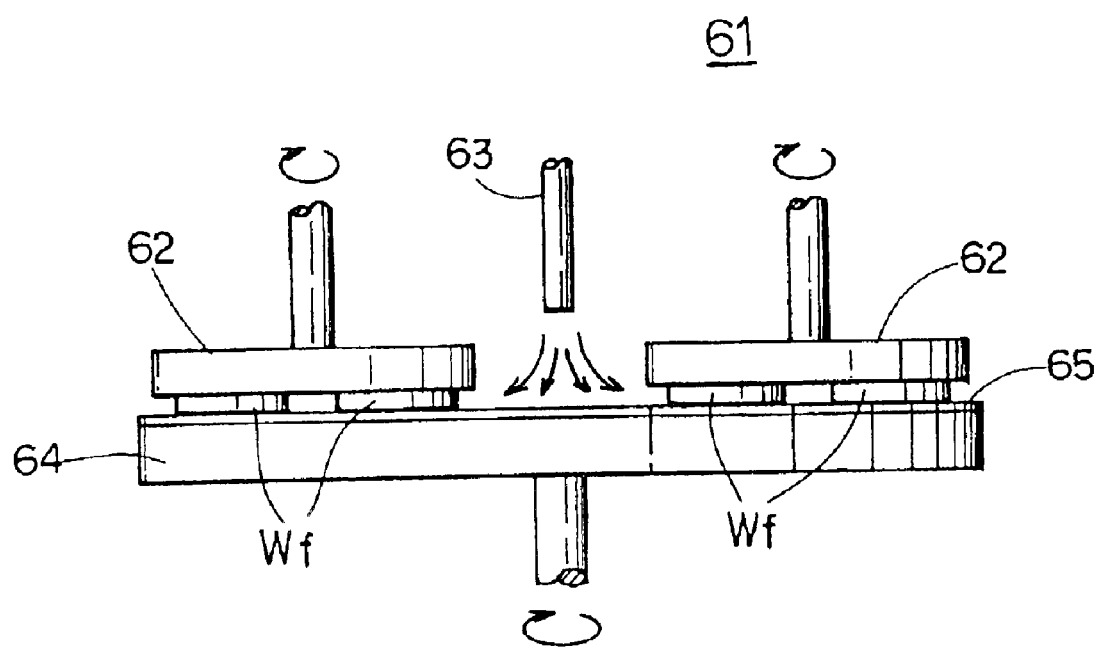
FIG. 6 is a schematic diagram of a polishing unit according to the first embodiment of the present invention.

Then, after having undergone a thermal processing to eliminate oxygen donors, a top surface of the silicon wafer "Wf" is mirror-polished. A single side mirror-polisher 61 shown in FIG. 6 is used to provide a chemical mechanical polishing to the top surface of the wafer Wf carried on a polishing head 62, by a polishing cloth 65 arranged over an upper surface of a lower platen under the condition of a polishing agent (slurry) containing colloidal silica being supplied from a nozzle 63 (S406). This removes the polysilicon film 12 on the top surface of the silicon wafer, so that the silicon face thereof can become mirror faced. Under this condition, as shown in FIG. 1(C), the top surface of the wafer 111 is a mirror surface, while the other faces than that, a bevel face 112 and a back surface 113, have still the polysilicon film 12 deposited thereon.

Figure 2:
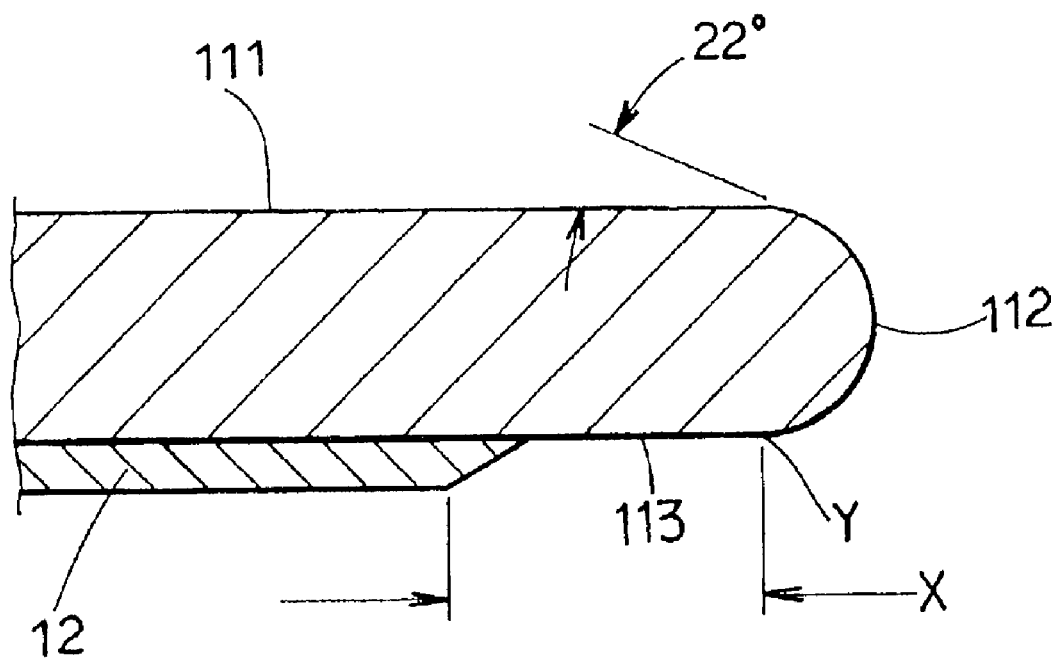
FIG. 2 is a sectional view of a silicon wafer with polysilicon in an edge portion having been removed according to the first embodiment of the present invention.
Figure 3:
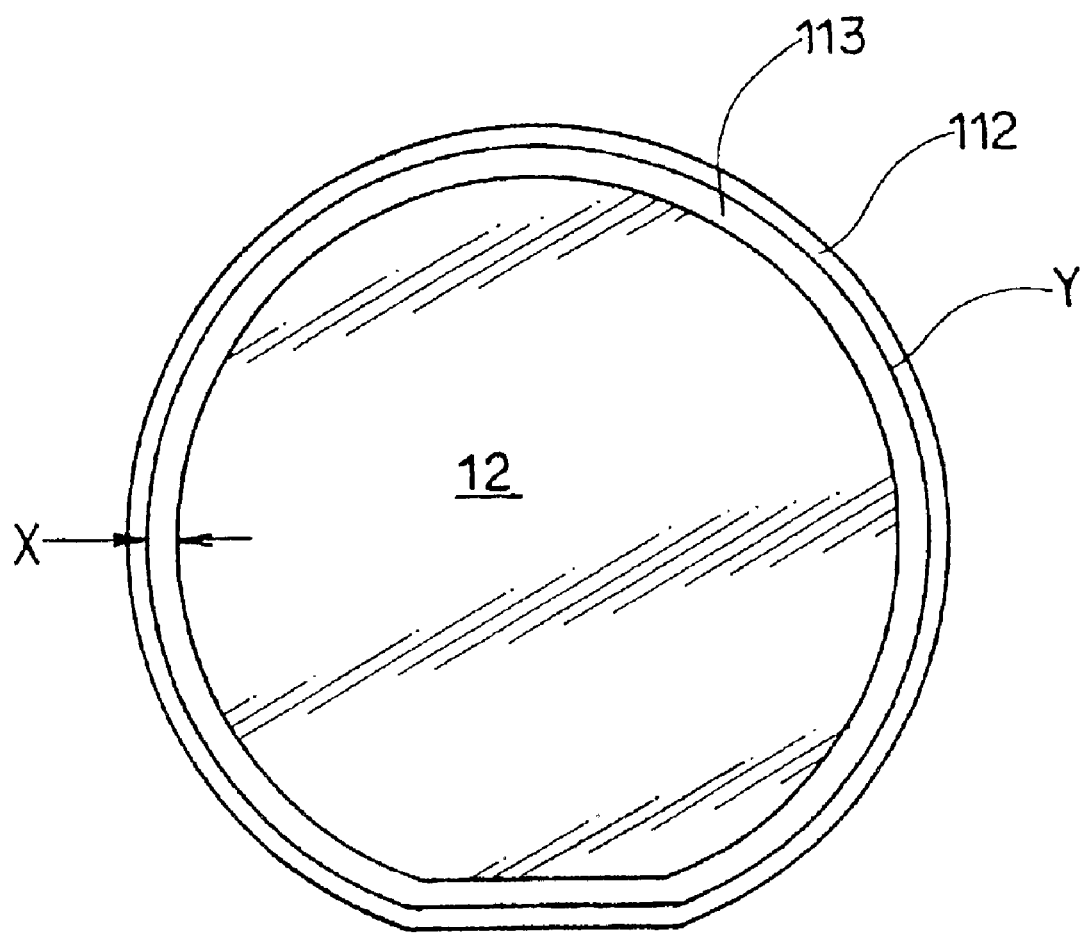
FIG. 3 shows a back surface of the semiconductor wafer according to the first embodiment of the present invention.
Figure 7:
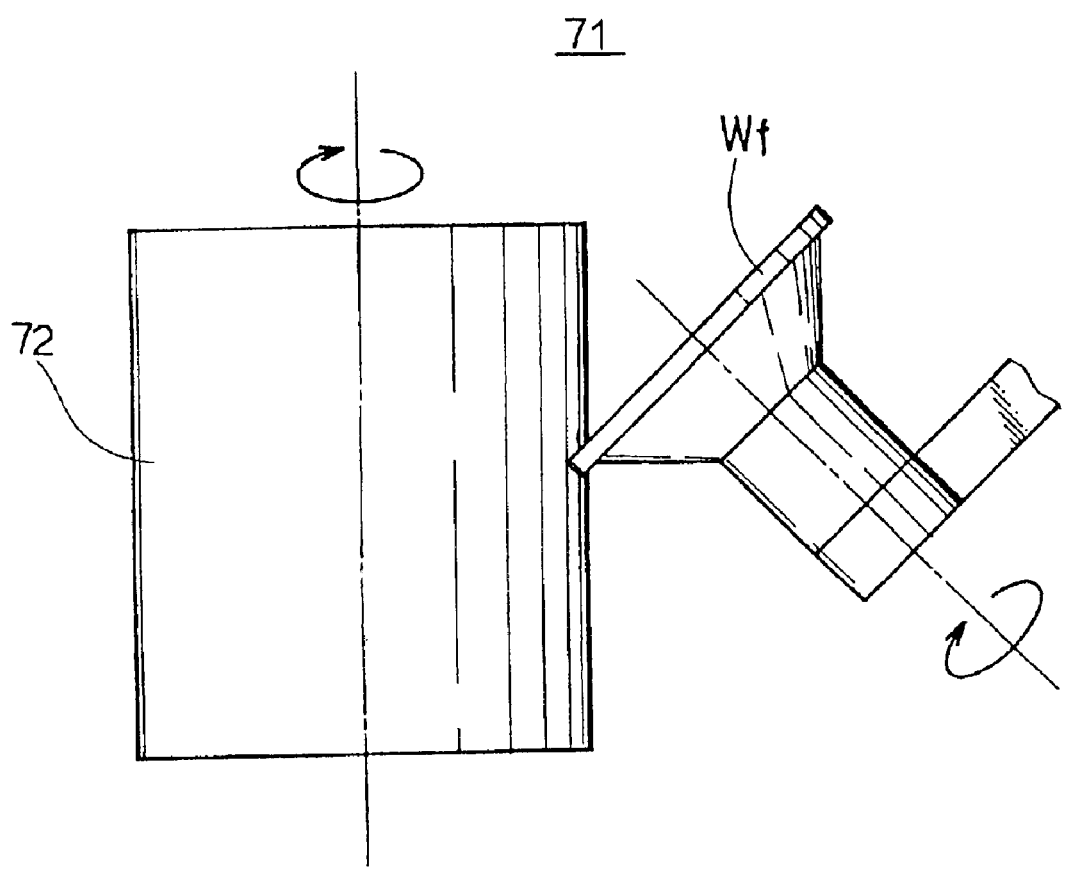
FIG. 7 is a schematic diagram of an edge polisher according to the first embodiment of the present invention.

After this step, an edge portion (a bevel portion) and its peripheral area of this polished wafer is edge-polished by using an edge polisher (PCR: Polishing Corner Rounding) (S407). FIG. 7 shows an edge polisher 71 to be used in this embodiment. Specifically, the rotating wafer Wf is brought into slidable contact with a revolving cylindrical polishing buff 72 at a predetermined angle under the slurry being supplied, so that a predetermined region 114 of the bevel face and the back surface of the wafer can be mirror-polished and thereby said polysilicon film in this region 114 can be removed to expose the silicon face. FIG. 1(D) shows the wafer having the silicon face in this region 114 exposed as the mirror surface and the back surface 113 excluding said area still having the polysilicon film 12 as deposited thereon. FIG. 2 shows this region in an enlarged scale. The example illustrated in FIG. 2 is a silicon wafer of MOS type exhibiting a sectional view thereof. In the drawing, the area defined by "X" is the region from which the polysilicon has been removed. "Y" designates a ridge line where the bevel face intersects with the back surface. It is to be noted that this removal of the polysilicon film may be made by means of other methods such as etching.

Figure 8:
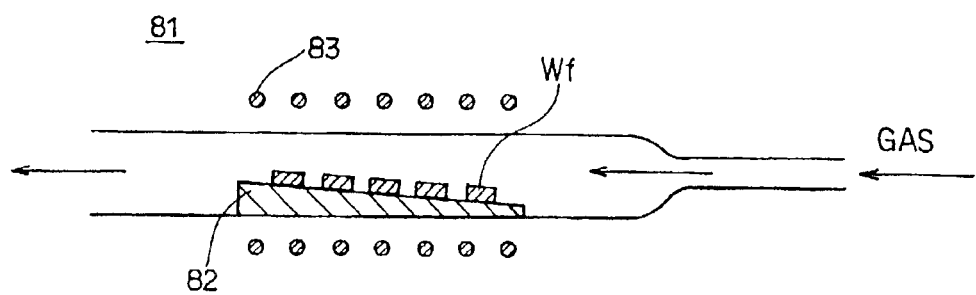
FIG. 8 is a schematic diagram of an epitaxial growth system according to the first embodiment of the present invention.

Then, each of those wafers is placed in an epitaxial furnace 81 shown in FIG. 8, and is kept under a specific temperature condition, for example, at 1100° C. so as for an epitaxial film 15 to grow up to 2 $\mu$m thick (S408). The wafer Wf is loaded on a susceptor 82 within the furnace, and the gas is supplied into the furnace while the wafer Wf being heated by a high frequency coil 83. As a result, such an epitaxial wafer can be manufactured in which the polysilicon film is deposited almost over an entire area on the back surface and the epitaxial film over the top surface and the bevel face, with the mirror-faced silicon face exposed in the area defined in the peripheral edge portion of the back surface adjoining the bevel face.

Figure 9:
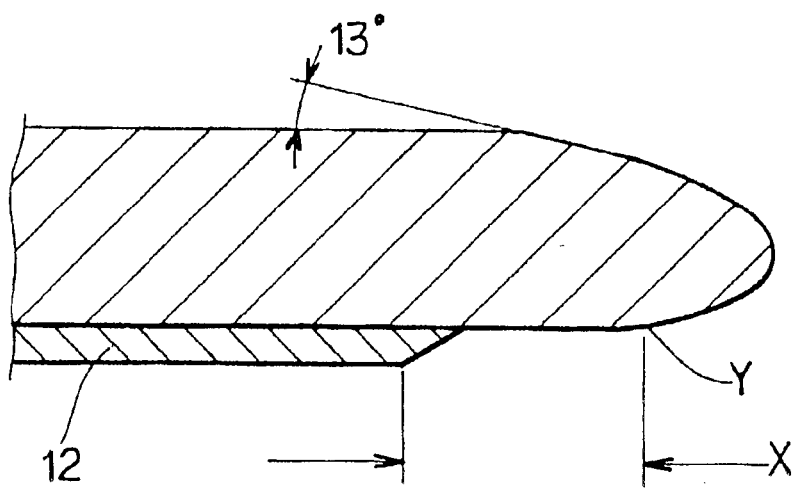
FIG. 9 is a sectional view for illustrating an exemplary application of the present invention to a semiconductor wafer having a different sectional geometry of edge portion.

Further, FIG. 9 shows a case where the present invention has been applied to a silicon wafer of bipolar type. For the silicon wafer having an edge sectional geometry of this type, removing polysilicon film on a back surface in a specified area "X" defined within a certain distance from a ridge line "Y" can bring about the similar effect.

Figure 10:
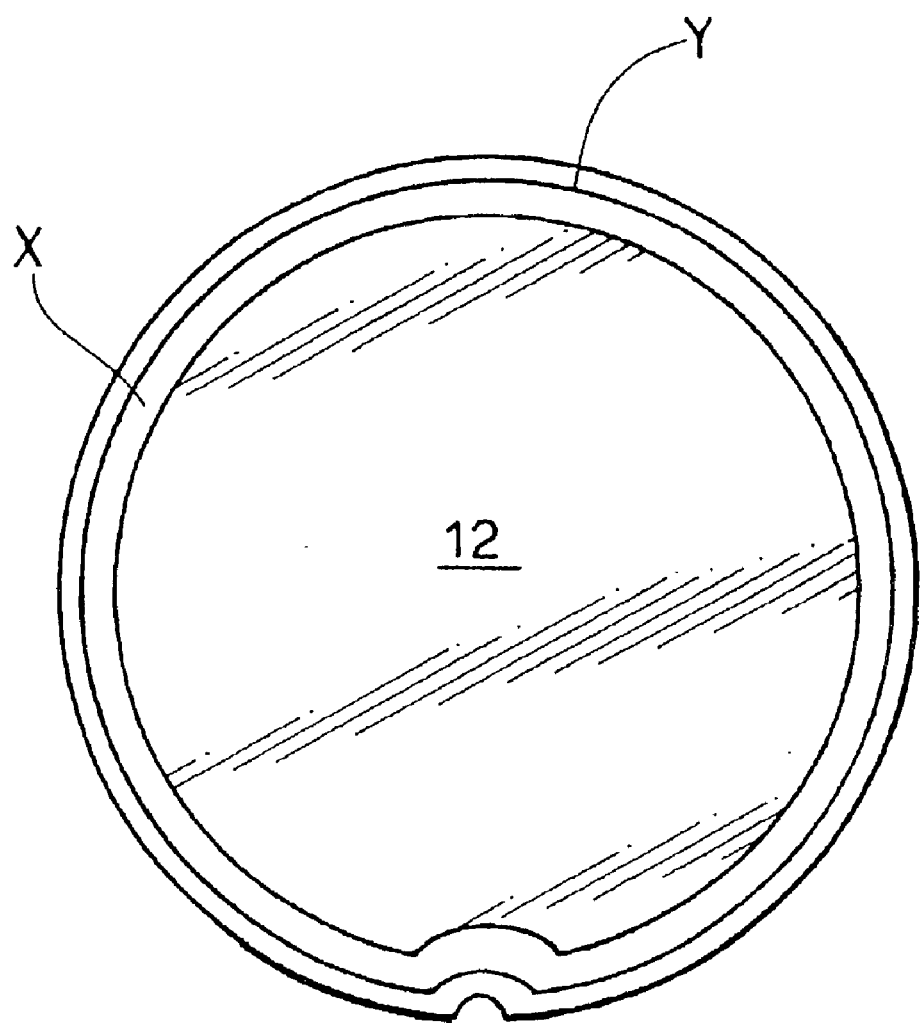
FIG. 10 shows a back surface for illustrating an application of the present invention to a semiconductor wafer having a notch.

It is to be noted that FIG. 10 shows an application of the present invention to a wafer having a notch. Removing a polysilicon film in a specified area on a back surface may have a similar effect on the wafer having the notch as compared with that of orientation flat type.

EXAMPLE

An experimental example will now be described. At first, an eight-inch P-type single crystal silicon ingot pulled up according to the CZ method was sliced with a wire-saw thus to form silicon wafers each having a predetermined thickness. After chamfering, lapping and acid etching having been applied to this wafer, the wafer was rinsed with purified water and dried, and thus etched wafer was then introduced in an upright CVD furnace, into which mono-silane gas was supplied at a temperature of 650° C. with a pressure level of 0.2 Torr to induce a thermal decomposition for one hour, thereby generating and depositing a polysilicon film having an averaged thickness of 1.1 $\mu$m over an entire area on the wafer.

In the next stage, a mirror-polishing was applied exclusively to a top surface of the silicon wafer to remove the polysilicon film from the top surface.

Further, an edge polisher was used to chamfer and polish a bevel face and a part of a back surface of the silicon wafer to remove the polysilicon film so that the silicon face could be exposed.

In this stage, the polishing time was changed diversely for polishing each of the wafers, thus manufacturing seven kinds of silicon wafers A to G each having a different width of an area from which the polysilicon film has been totally removed.

After this stage, a SEM was used to observe and determine whether or not the polysilicon film had been completely removed. The portion with the exposed single crystal silicon, the region with the polysilicon deposited in granules, and the region with said granulated polysilicon deposition having been abraded to a certain level can be clearly distinguished one from another based on whether or not a granulated structure or a recrystallized structure presented and on a difference of the glossiness observed in the specific SEM image, and thus the followings have been read by the SEM observation:

A: having no area width with the polysilicon totally removed;

B: having 30 $\mu$m wide, region with the polysilicon totally removed;

C: having 50 $\mu$m wide region with the polysilicon totally removed;

D: having 100 μm wide region with the polysilicon totally removed;

E: having 200 μm wide region with the polysilicon totally removed;

F: having 300 μm wide region with the polysilicon totally removed;

G: having 500 μm wide region with the polysilicon totally removed.

Then, for each of those wafers, an eight-inch single wafer processing epitaxial furnace (a centura furnace from Applied Materials Inc.) was used so as for the epitaxial film to grow up to 2 μm thick at the temperature of 1100° C.

Further, after the epitaxial film having grown, an evaluation as will be described below was applied as an example of the evaluation on a particle generation during handling of the wafer.

Figure 11:
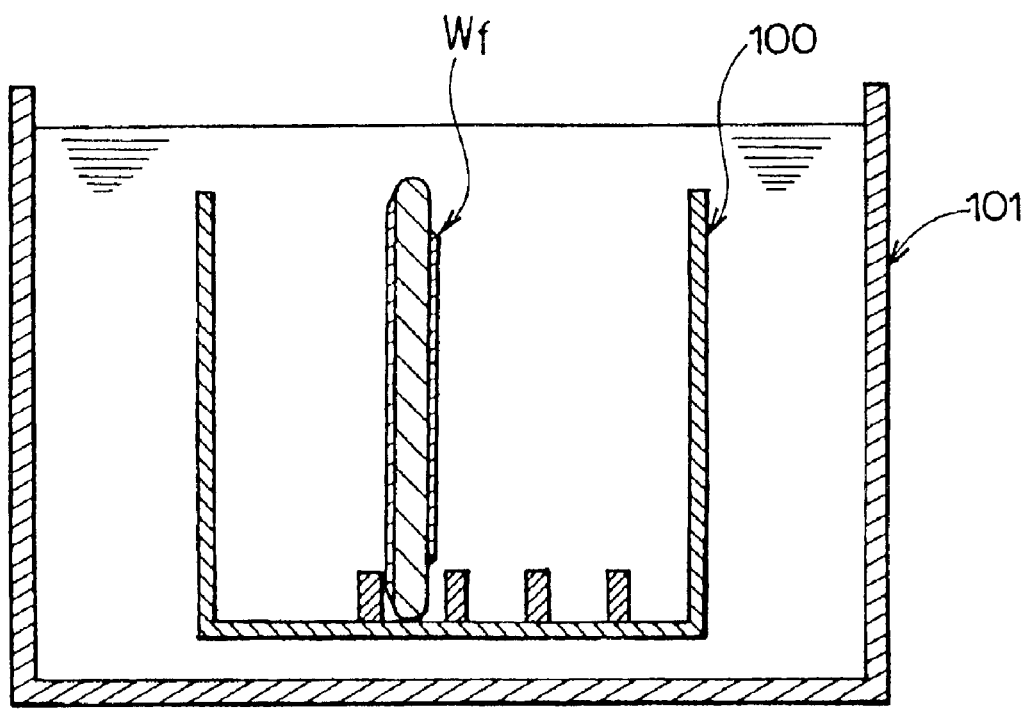
FIG. 11 is a schematic diagram showing an overview of a unit for evaluating a deposition of LPD on the semiconductor wafer according to the first embodiment of the present invention.
Figure 12:
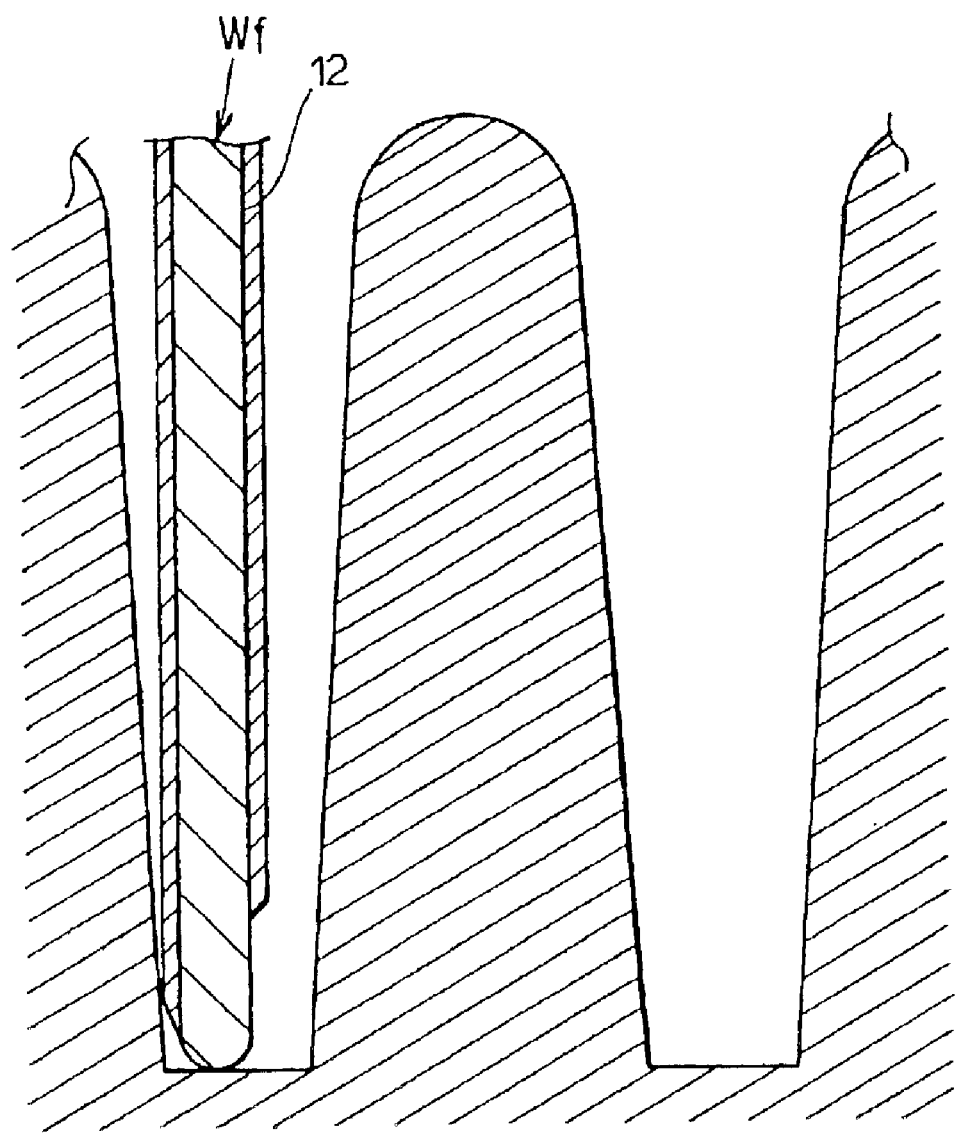
FIG. 12 is an enlarged schematic diagram showing a main part of the unit for evaluating a deposition of LPD on the semiconductor wafer according to the first embodiment of the present invention.

As shown in FIGS. 11 and 12, those wafers Wf were put into a cleaning vessel 100 one by one and dipped in a cleaning bath 101 filled with ultra-purified water, which was in turn swung for 10 minutes with the wafers contained inside. For example, the vessel made a swingy reciprocating motion in right and left directions each at the angle of about 30° for 10 minutes. After that, the silicon wafers Wf were dried by way of the spinner drying. Then, a surface particle counter was used to count the number of particles on the top surface of each wafer. A table 1 shows a result of measurement in counting the number of particles on each wafer as before and after the processing.

FIG. 12 is an enlarged view of a site in which the carrier 100 contacts with the silicon wafer Wf 100 as in FIG. 11. In this arrangement, the top edge portion and the ridge line portion where the bevel portion meets the flat face (the back surface) of the silicon wafer Wf are both in touch with the inner wall of the carrier 100. It is to be noted that using the purified water in water solution contained in the cleaning vessel allows the evaluation to be applied exclusively to the particles without eliciting defects from the etching effect.

TABLE 1

| No. | Width of region with polycrystal Si removed completely before epi. growth (μm) | Width of region with no polycrystal Si generated after epi. growth (μm) | Increasing amount of particles (piece/wafer) |
| --- | --- | --- | --- |
| Compared example 1 | 0 | 0 | 17 |
| Example 1 by the present invention | 30 | 30 | 16 |
| Example 2 by the present invention | 50 | 50 | 12 |
| Example 3 by the present invention | 100 | 100 | 10 |
| Example 4 by the present invention | 200 | 200 | 9 |
| Example 5 by the present invention | 300 | 300 | 9 |
| Example 6 by the present invention | 500 | 500 | 9 |

From the experimental result described above, it has been found that the width of the region with the polysilicon film removed completely before the epitaxial growth (the distance from the ridge line where the edge portion meets the back surface) coincides with the width of the region with no polysilicon having been generated after the epitaxial growth. It has been also found that an effect of inhibition on the particle increase after the experiment has reached the uppermost level for the wafer having the region width of 50 μm or more with the polysilicon completely removed therefrom. Therefore, it has been confirmed that removing the polysilicon completely over the width of 50 μm or greater in the area adjacent to the ridge line works effectively to prevent dusts from being produced during the wafer cleaning process after the epitaxial growth.

As described above, according to the present invention, it is possible to inhibit efficiently the dusts from being produced from such a wafer having a polysilicon film on a back surface.

What is claimed is:

1. An epitaxial semiconductor wafer having a wafer substrate made of semiconductor single crystal, an epitaxial layer deposited on a top surface of said wafer substrate and a polysilicon layer deposited on a back surface of said wafer substrate, said epitaxial semiconductor wafer characterized in that said semiconductor single crystal is exposed in a region defined within s distance of at least 50 μm from a ridge line as a center, which is defined as an intersection line between said back surface and a bevel face interconnecting said top surface and said back surface of said wafer substrate.

2. An epitaxial semiconductor wafer in accordance with claim 1, in which said polysilicon layer is 1.0 to 2.0 μm thick.

3. An epitaxial semiconductor wafer in accordance with claim 1, in which said epitaxial layer is 1.0 to 20 μm thick.

4. An epitaxial semiconductor wafer in accordance with claim 1, in which said wafer substrate is a silicon single crystal.

5. An epitaxial semiconductor wafer having a wafer substrate made of semiconductor single crystal and a polysilicon layer deposited on a back surface of said wafer, in which an epitaxial layer is to be formed on a top surface of said wafer substrate, said epitaxial semiconductor wafer characterized in that said semiconductor single crystal is exposed in a region defined within a distance of 300 μm from a ridge line as a center, which is defined as an intersection line between said back surface and a bevel face interconnecting said top surface and said back surface of said wafer substrate.

6. An epitaxial semiconductor wafer in accordance with claim 5, in which said polysilicon layer is 1.0 to 2.0 μm thick.

7. An epitaxial semiconductor wafer in accordance with claim 5, in which said epitaxial layer is 10 to 20 μm thick.

8. An epitaxial semiconductor wafer in accordance with claim 5, in which said wafer substrate is a silicon single crystal.

* * * * *